United States Patent [19]

Hunsinger et al.

[11] Patent Number: 5,225,798
[45] Date of Patent: Jul. 6, 1993

[54] PROGRAMMABLE TRANSVERSAL FILTER

[75] Inventors: Billy J. Hunsinger; James E. Bales, both of Urbana, Ill.

[73] Assignee: Electronic Decisions Incorporated, Urbana, Ill.

[21] Appl. No.: 707,147

[22] Filed: May 31, 1991

Related U.S. Application Data

[63] Continuation-in-part of Ser. No. 309,222, Feb. 13, 1989, abandoned.

[51] Int. Cl.[5] .................. G11C 19/28; H01L 29/78; H03H 15/02
[52] U.S. Cl. ............................ 333/165; 257/217; 257/236; 257/239; 257/241; 257/245; 257/472; 377/60
[58] Field of Search ............ 357/24; 377/57-63; 333/165; 257/217, 236, 239, 241, 245

[56] References Cited

U.S. PATENT DOCUMENTS

| | | | |
|---|---|---|---|
| 3,809,923 | 5/1974 | Esser | 333/165 |
| 3,858,232 | 12/1974 | Boyle et al. | 357/24 |
| 4,052,605 | 10/1977 | Eggermont | 333/165 |
| 4,340,875 | 7/1982 | English | 333/165 |
| 4,633,285 | 12/1986 | Hunsinger et al. | 357/24 |
| 4,639,940 | 1/1987 | Ohtsuki | 333/165 |
| 4,799,244 | 1/1989 | Mikoshiba et al. | 357/24 |
| 5,144,262 | 9/1992 | Hunsinger | 333/165 |
| 5,159,299 | 10/1992 | Cullen et al. | 333/165 |

OTHER PUBLICATIONS

Hoskins et al. "Charge Transport by Surface Acoustic Waves in GaAs" Appl. Phys. Lett, vol. 41 (Aug. 15, 1982) pp. 332-334.

Oates et al., "SAW/FET Programmable Transversal Filter w/100-MHz Bandwidth & Enhanced Programmability" 1985.

Chiang et al., "A High-Speed Digitally Programmable CCD Transversal Filter," IEEE Journal of Solid-State Circuits, Dec. 1983.

Tower, et al., "A CMOS/CCD 256-Stage Programmable Transversal Filter," IEEE Journal of Solid-State Circuits, Dec. 1982.

Haken et al., "A General Purpose 1024-Stage Electronically Programmable Transversal Filter" IEEE Journal of Solid-State Circuits, Dec. 1980.

Magill et al., "Charge-Coupled Device Pseudo-Noise Matched Filter Design," Proceedings of the IEEE, Jan., 1979.

Denyer et al., "Miniature Programmable Transversal Filter Using CCD/MOS Technology," Proceedings of the IEEE, Jan. 1979.

Cox et al., "A Real-Time Programmable Switched-Capacitor Filter," IEEE Journal of Solid-State Circuits, Dec. 1980.

Munroe, "CCD-Based Signal Processing for Spread Spectrum Systems," AFCEA Tactical Communications, Apr. 22-24, 1986.

Bosshart, "An Integrated Analog Correlator Using Charge-Coupled Devices," 1976 IEEE Int'l. Solid-State Circuits Conference, Feb. 20, 1976.

Burke et al., "A CCD Time-Integrating Correlator," IEEE Journal of Solid-State Circuits, Dec. 1983.

Tanaka et al., "An Integrated Real-Time Programmable Transversal Filter," IEEE Journal of Solid-State Circuits, Dec. 1980.

Gandolfo et al., "Analog-Binary CCD Correlator: A VLSI Signal Processor," IEEE Transactions on Electron Devices, Apr. 1979.

Green et al., "Adaptive & Matched Filtering w/a SAW/FET Programmable Transversal Filter," 1986 Ultrasonics Symposium.

*Primary Examiner*—Gene M. Munson
*Attorney, Agent, or Firm*—Shlesinger, Arkwright & Garvey

[57] ABSTRACT

A transversal filter comprises an acoustic charge transport device comprising an input contact for introducing a signal into a buried channel through which the signal is transported by a high frequency acoustic wave and a plurality of non-destructive sense electrodes overlying the channel for successively sampling the signal. A memory device is provided for storing a plurality of tap weight signals, with each tap weight signal for being associated with one of the electrodes. A multiplier system is operably connected with each of the electrodes and with the storage device for generating the product of the signal sampled at each electrode and the associated tap weight signal. A summer is operably associated with the multiplier for summing the products and thereby generating an output signal.

14 Claims, 8 Drawing Sheets

PROGRAMMABLE TRANSVERSAL FILTER

GOVERNMENT SUPPORT

This invention was made with government support under contract number F-30602-85-C-0170 awarded by the Department of Defense. The government has certain rights in this invention.

RELATED PATENT APPLICATIONS

This application is a continuation-in-part application of application Ser. No. 07/309,222, filed on Feb. 13, 1989, now abandoned.

BACKGROUND OF INVENTION

A transversal filter is an electronic device that accepts input information in the form of an analog electrical signal and processes the input information according to a set of electrical signals applied to a second input, referred to as a programming or reference input. The processed information is supplied as an analog electrical output signal.

The ACT programmable transversal filter (PTF) is an ACT integrated circuit based high speed analog signal processing device which provides the capability to realize arbitrary transversal filter impulse responses. This is achieved through a device architecture which permits independent digital programming of each of the tap weights in an ACT transversal filter.

A conventional transversal filter has a single delay line which is periodically tapped to provide the required incrementally delayed replicas of the input signal. Prior transversal filters have utilized conventional surface acoustic wave ("SAW") structures, or charge coupled devices ("CCD") as the delay line. The delayed replicas are multiplied by predetermined coefficients, known as tap weights, and the products are summed to form the output signal. The tap weights may be determined by fixed device features so that they are permanently established, or they may be programmable in order to permit the filter response to be determined dynamically by electronic means.

Attempts have been made to combine surface acoustic wave or charge coupled device delay lines with electronic circuitry necessary for loading and storing the tap weight reference signals, as well as the circuitry necessary to permit the tap weight signals to be multiplied by the delayed input signal replicas. The surface acoustic wave devices have, in the past, been hybrid combinations of one type or another. The primary difficulty in hybrid approaches, however, involves difficulty in manufacturing, signal frequency bandwidth limitations and tap weight control speed degradation caused by the interconnecting bond requirements between either the delay line taps and the multiplying circuit, or between the multiplying circuit and the tap weight storage cells.

An acoustic charge transport device ("ACT device") is a novel analog semiconductor device which is particularly useful as a delay line, and for performing various signal processing functions. The ACT device overcomes many of the problems of the prior charge coupled devices, because the ACT device processes signals at extremely high speeds while avoiding the necessity of clock driver circuitry. The ACT device achieves its high processing speed because a surface acoustic wave propagates through a channel buried within the piezoelectric semiconductor substrate, and the wave transports the charge, representative of the input signal, through the channel at the wave speed. The charge is transported in discrete identifiable packets. Transportation of charge through the buried channel produces an output at the drain (output contact) which is in the form of sharp current pulses.

The voltage-to-charge conversion process occurring at the ACT device input (input contact) is one wherein the amount of charge injected into each packet is proportional to the input voltage at specific sample points in time. In the ACT device, these sample points tend to occur at the instants in time when the positive peaks of the potential are under the input contact. Hence, the input contact of the ACT device operates as an automatic time domain sampler, having a sampling rate equal to the frequency of the propagating surface acoustic wave. The ACT device has very broad band characteristics enabling the device to process signals from baseband to many hundreds of megahertz. In addition, the ACT device utilizes a GaAs substrate which permits the use of high speed circuits for the implementation of additional high frequency signal processing functions, such as RF signal gain blocks.

Those skilled in the art will understand that there is a need for programmable transversal filter which avoids the interconnecting bond limitations of prior surface acoustic wave technology, and which furthermore overcomes the bandwidth limitations attributable to charge coupled device technology. The disclosed invention provides just such a novel programmable transversal filter by utilizing an ACT device in a manner which permits the delay, multiplication, summation and storage functions to be done in close proximity on the same substrate, in order to avoid bond wire interconnections while also advantageously utilizing the broad bandwidth characteristics of an ACT device.

OBJECTS AND SUMMARY OF THE INVENTION

The primary object of the disclosed invention is a programmable transversal filter which eliminates the bond wire interconnects normally required with conventional surface acoustic wave technology, while also possessing a bandwidth superior to that provided by charge coupled device technology.

An additional object of the disclosed invention is a method of operating a programmable transversal filter in a manner which permits the increased bandwidth response of an ACT device to be advantageously utilized.

A transversal filter according to the invention comprises an acoustic charge transport device comprising input means for introducing a signal into a buried channel through which the signal is transported by a high frequency acoustic wave, and a plurality of nondestructive sense electrodes which overly the channel for successively sampling the signal. Means for storing a plurality of tap weight signals are provided, and each tap weight signal is for being associated with one of the electrodes. Multiplier means are operably associated with each of the electrodes and with the storing means for generating the product of the signal sampled at each electrode and the associated tap weight signal. Means are operably associated with the multiplier means for summing the products, and thereby generating an output signal.

A programmable transversal filter comprises at least a first acoustic charge transport device comprising a piezoelectric semiconductor substrate overlaid with a barrier material for therewith defining a buried channel, transducer means are operably associated with the channel for propagating a high frequency acoustic wave through the channel, input means are disposed at one end of the channel for injecting charge representative of a signal into the channel so that the charge is transported by the wave therethrough and output means are at an opposite end of the channel for extracting the charge therefrom, and a plurality of electrodes overlie the channel for sampling the charge as it is transported therethrough. Programmable storage means for storing a plurality of tap weight signals are provided, and each tap weight signal is for being associated with one of the electrodes. Means are operably associated with the storage means for modifying the tap weight signal of at least one electrode. Multiplier means are operably associated with each of the electrodes and with the storage means for generating the product of the signal sampled at each electrode and the associated tap weight signal. Means are operably associated with the multiplier means for summing the products.

The method of filtering a signal comprises the steps of providing at least a first acoustic charge transport device comprising a piezoelectric semiconductor substrate overlaid with a barrier material and therewith defining a buried channel, transducer means are at one end of the channel for propagating a high frequency acoustic wave therethrough, input means are disposed at the same end of the channel for injecting charge representative of a signal and for thereby causing the charge to be transported through the channel by the wave to an output means through which the charge is extracted, and a plurality of electrodes are disposed along the substrate above the channel for sampling the charge as it is transported therethrough. Charge representative of a signal is injected into the channel through the input means. The charge sampled at each electrode is multiplied by a predetermined factor and thereby a product is generated for each electrode. The products are summed.

These and other objects and advantages of the invention will be readily apparent in view of the following description and drawings of the above described invention.

DESCRIPTION OF THE DRAWINGS

The above and other objects and advantages and novel features of the present invention will become apparent from the following detailed description of the preferred embodiment of the invention illustrated in the accompanying drawings, wherein.

DETAILED DESCRIPTION OF THE INVENTION

Figure 2:
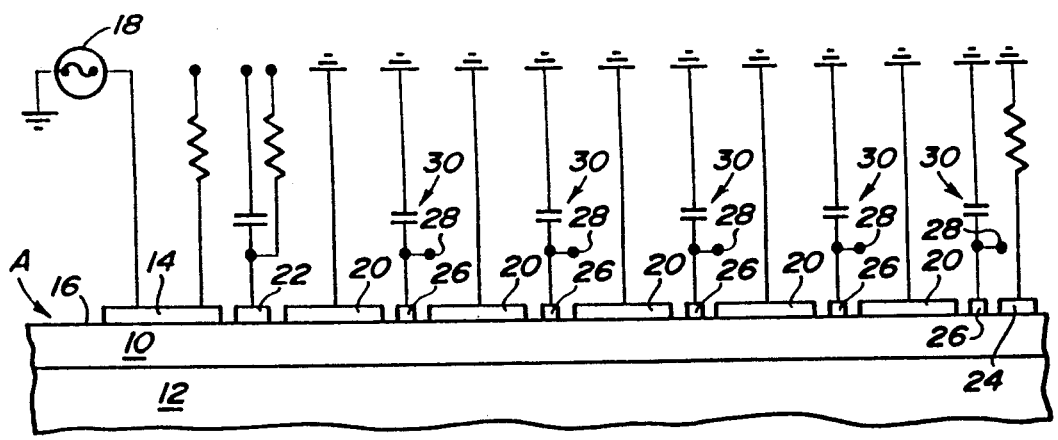
FIG. 2 is a fragmentary cross-sectional view of an acoustic charge transport device.

Acoustic charge transport device ("ACT device") A, as best shown in FIG. 2, comprises an active piezoelectric semiconductor layer 10 mounted on substrate 12. The layer 10 is, preferably, comprised of gallium arsenide.

Transducer 14 is mounted to surface 16 of substrate 10. Source 18 provides an energizing signal to the negatively biased piezoelectric transducer 14, in order to cause generation of a high frequency surface acoustic wave which propagates through substrate 10. The transducer 14 generates a surface acoustic wave having a wavelength of approximately 7.9 microns over a beam width of 140 wavelengths at a source frequency of 367.1 MHz.

A plurality of aluminum Schottky barrier plates 20 are uniformly positioned on surface 16 of substrate 10. An input contact or like structure 22 is interposed between transducer 14 and the first of Schottky barrier plates 20, and is adapted for injecting charge representative of a signal into the underlying transport channel so that the charge is transported by the wave generated by transducer 14. An output contact or like structure 24 is provided at the opposite end of substrate 10 for extracting charge from the substrate 10 after it has been transported therethrough by the surface acoustic wave. Depletion of the channel electrons under the Schottky barriers 20 causes a transport channel to be defined in the substrate 10, and the surface acoustic wave generated by the transducer 14 causes charge injected through input contact 22 to be transported through the channel to output contact 24. Means may be provided around the transport channel for minimizing electrical interaction with adjacent structures and for further defining the transport channel. My prior patent, U.S. Pat. No. 4,633,285, issued Dec. 30, 1986 for ACOUSTIC CHARGE TRANSPORT DEVICE AND METHOD, the disclosure of which is incorporated herein by reference, utilizes guard rings around the device for this purpose, although like effects may be achieved through selective proton bombardment of substrate 10.

A plurality of non-destructive sense electrodes or taps 26 are disposed along surface 16 in uniformly spaced relation. Each of the non-destructive sense electrodes 26 is, preferably, disposed between two adjacent barrier plates 20. The non-destructive sense electrodes 26 have an output terminal 28 which is coupled through capacitor 30 to ground. The electrodes 26 are non-destructive because they do not interfere with or otherwise inhibit transport of the charge packets.

As noted in my earlier cited patent, charge injected into the transport channel through input contact 22 is transported through the channel with the surface acoustic wave generated by transducer 14. The charge is transported in the positive half cycles of the wave, and the charges are bunched by the wave in discrete identifiable packets. Movement of the charge packets through the channel causes an image charge to be impressed upon each of the non-destructive sense electrodes 26 as the packets pass below. The image charges move with the associated charge packets, with the result that the non-destructive sense electrodes 26 sense the charge quantities of the packets as they move along the channel, and therefore permit this quantity to be determined. The result is that the non-destructive sense electrodes 26 each provides an output at the associated terminal 28 which is representative of the charge being transported by the surface acoustic wave at the point in time and at the location in the channel.

Figure 1:
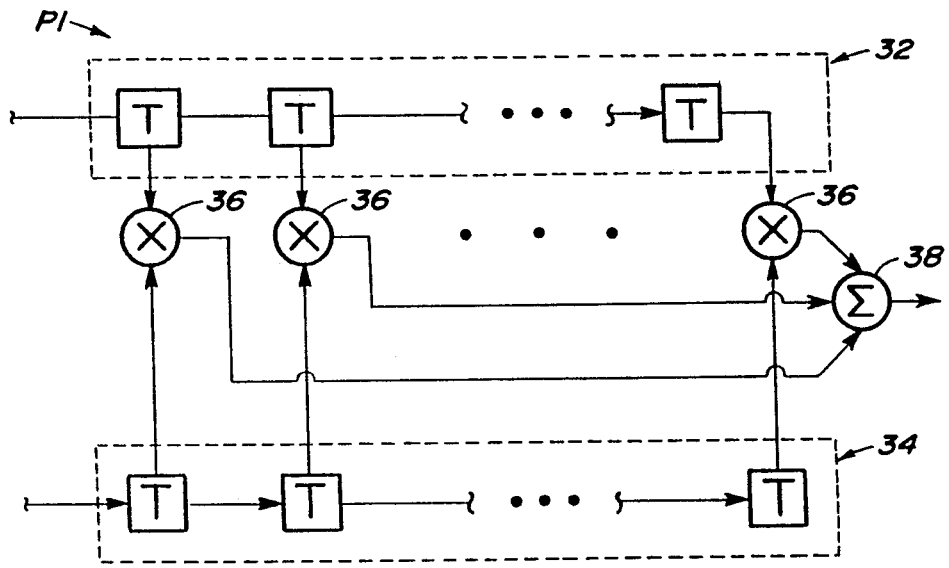
FIG. 1 is a schematic plan view of a first embodiment of a programmable transversal filter according to the invention.

FIG. 1 discloses a programmable transversal filter using two ACT devices 32 and 34, both of which correspond with the ACT device A of FIG. 2, although we have omitted the barrier elements and other structures for clarity. Each of the ACT devices 32 and 34 has a plurality of taps T which correspond to the non-destructive sense electrodes 20 of ACT device A. For each tap T of ACT device 32, there is at least one tap T of ACT device 34. Also, we prefer that the taps T be uniformly spaced apart in order that the sampling of the charge packets occur at constant time intervals.

Each of the taps T of ACT device 32 is operably connected to a multiplier 36. Likewise, each associated tap T of the ACT device 34 is operably connected to its associated multiplier 36. The multipliers 36 provide for analog multiplication, and may include a balanced mixer circuit or the like. The multipliers 36 multiply the analog signals or image charges sensed by each of the terminals T of the ACT devices 32 and 34, and thereby generate a product signal. The product signals are summed by summing means 38, to which each of the multipliers 36 is operably connected. The summing means 38 outputs a signal which therefore represents the summation of the products generated by the multipliers 36.

Prior art transversal filters have three basic components; namely, a delay line, a multiplying means and a summing means. We have found that the structure of FIG. 1 operates as a programmable transversal filter because of the non-destructive image charge sensing provided by the taps T. The acoustic charge transport device 32 may have input thereto a signal or waveform of interest, while the acoustic charge transport device 34 has input thereto a signal or waveform representative of the tap weights which are to be used by the multipliers 36. Due to the clocking property provided by the surface acoustic wave propagating through the associated buried channel, then the acoustic charge transport device 34 operates as an analog shift register. Additionally, device 34 can be operated in such a way as to cause the individual samples of the tap weight waveform to be stored temporarily, permitting the tap weights to be programmed or altered as necessary. While we have illustrated the transversal filter P1 of FIG. 1 as having six taps T, those skilled in the art will appreciate that a greater number will normally be utilized.

Prior to operation of transversal filter P1 of FIG. 1, the desired filter response function is established, and an analog signal generated using external circuitry that represents the impulse response corresponding to that desired filter response. The analog signal may be referred to as the reference waveform. Device operation is initiated by clocking the reference waveform into the analog shift register or ACT device 34 and adjusting the barrier electrode potentials to cause the reference waveform to be stored in device 34. The information bearing input waveform is likewise clocked into ACT device 32 through its associated input contact. The information bearing input signal waveform is sampled at a rate determined by the surface acoustic wave frequency associated with the ACT device 32. We prefer that the clocking frequency for the devices 32 and 34 be identical, and this may be achieved by exciting the associated transducers from a common source, or even providing a common transducer.

As the charge packets of the ACT devices 32 and 34 are sampled by the associated taps T, then the impressed image charges are multiplied by the multipliers 36, and the products summed by the summing means 38. It should be noted that the sampling occurs essentially automatically as the charge packets move down the channel. Use of the ACT device 34 as an analog shift register, having the capability of programming the tap weights for the multipliers 36, permits the response of filter P1 to be determined dynamically by electronic means. The device P1 therefore is an interactively programmable component of an integrated signal processing system.

Figure 3:
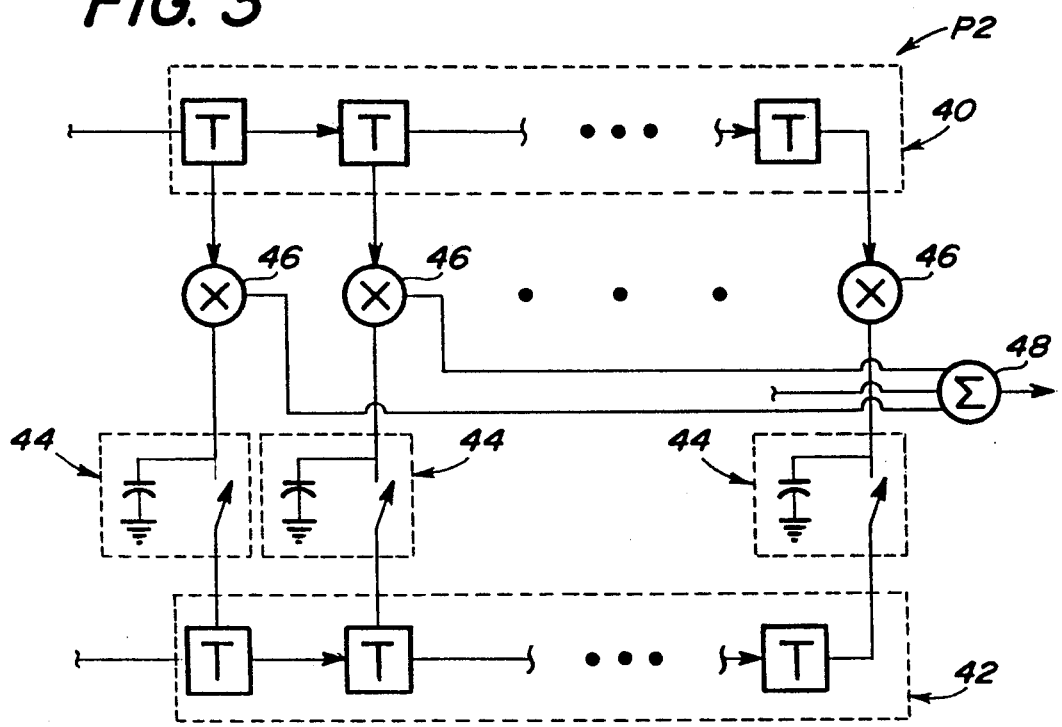
FIG. 3 is a fragmentary schematic plan view of a second embodiment of the transversal filter of FIG. 1.

The transversal filter P2 of FIG. 3 is similar to the transversal filter P1 of FIG. 1 because of the use of ACT devices 40 and 42. Each of the taps T of ACT device 42 is operably connected with a sample and hold circuit 44. The sample and hold circuits 44 store the tap weight reference signals and are operably connected to analog multipliers 46. The taps T of the ACT device 40 are likewise operably connected with the multipliers 46, such that the resulting product may be summed by the summing means 48 in order to generate the output signal. The sample and hold circuits 44 are sequentially addressed during the analog tap weight reference signal load operation. The reference waveform must be periodically refreshed, in order to assure that the appropriate tap weight signal is applied through the associated sample and hold circuit 44 to the associated multiplier 46.

Figure 4:
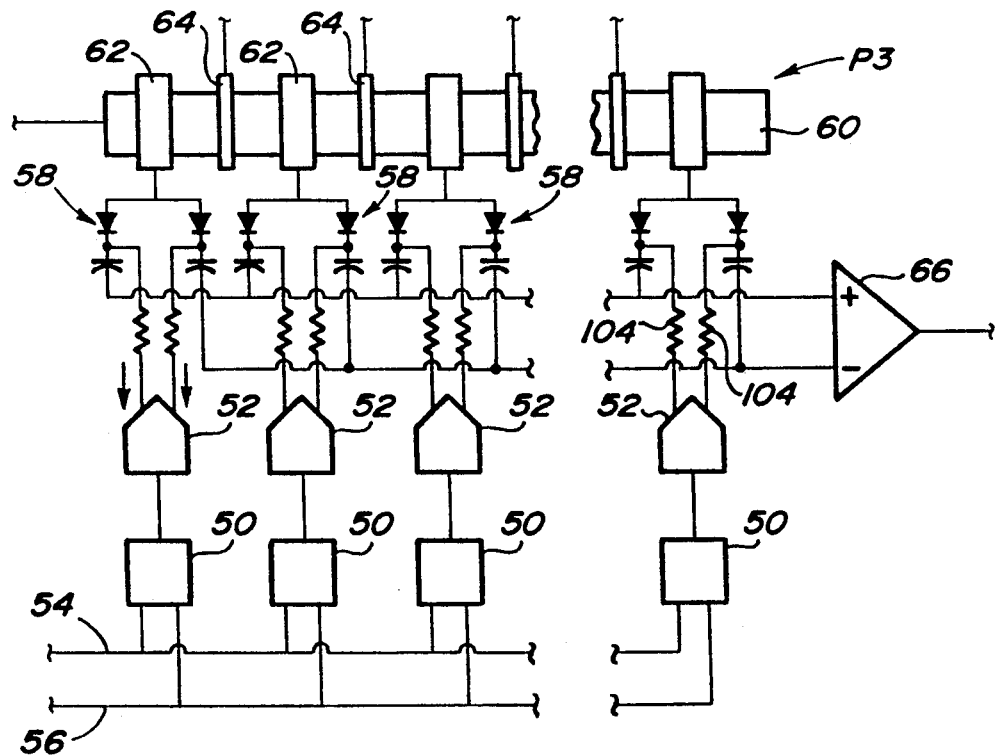
FIG. 4 is a fragmentary schematic plan view of a third embodiment of a transversal filter according to FIG. 1.

The transversal filter P3 of FIG. 4 is a digital/analog programmable transversal filter, because the tap weight coefficients are binary coded digital words and their RF input signals are analog waveforms. The filter P3 has digital storage registers 50 for storing the tap weight coefficients. Each of the digital storage registers 50 is operably connected with a digital to analog converter 52, which converts the binary word into an analog signal. The data and address bus lines 54 and 56, respectively, comprise M and P parallel bits, where $P = \log_2 n$, and n is the number of filter taps. The resulting analog tap weight is then applied to an analog circuit element, such as diode pairs 58, for accomplishing the multiplication function by variation of the forward biased diode resistance resulting from the digital to analog converters 52.

ACT device 60 of filter P3 has taps 62 uniformly periodically spaced therealong. As with the ACT device A of FIG. 2, barrier elements 64 are interposed therebetween along the piezoelectric semiconductor substrate surface for defining the transport channel. Each of the taps 62 is operably connected with one of the diode pairs 58, and each of the diode pairs 58 is operably connected with amplifier 66 for generating the summation of the products. Preferably, all components of filter P3 are fabricated on a common substrate.

Figure 5:
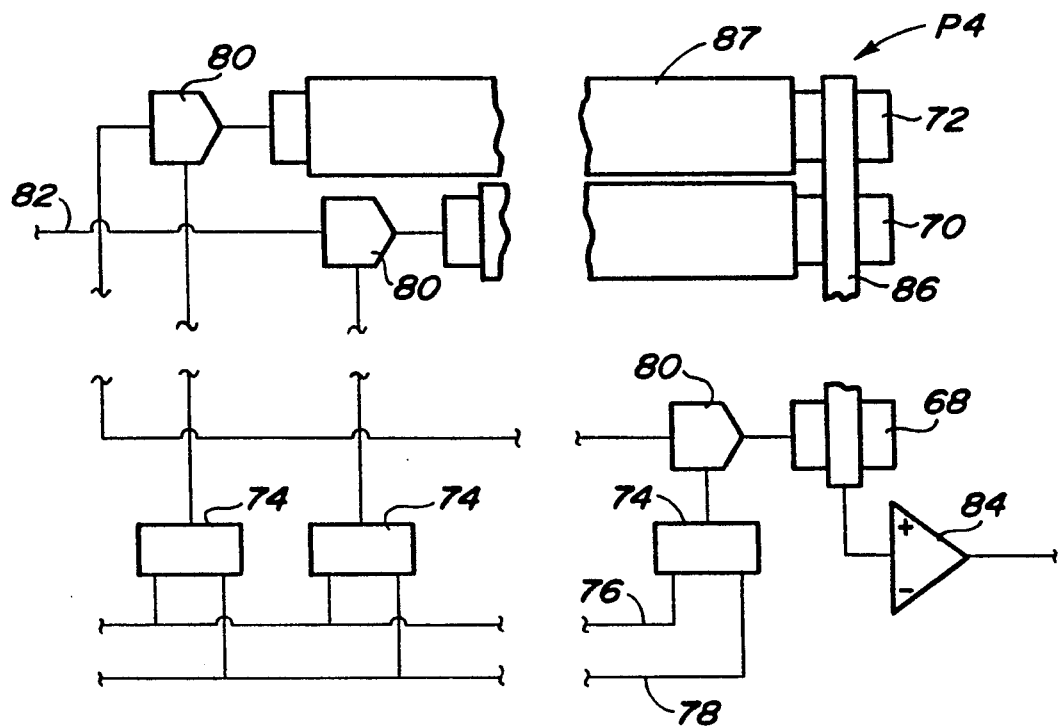
FIG. 5 is a fragmentary schematic plan view of a fourth embodiment of a transversal filter according to the invention.

One disadvantage of the filter P3 is that the performance is limited by the uniformity of the diodes and capacitors used in the analog multiplier circuits. One means of overcoming this drawback is through the utilization of a plurality of substantially uniform ACT devices, such as illustrated in FIG. 5 for the filter P4. The filter P4 utilizes ACT devices 68, 70 and 72, although those skilled in the art will appreciate that a greater number of such devices would normally be utilized. The devices 68, 70 and 72 are substantially identical, with the exception that the transport channel length uniformly increases from device 68 to device 70 to device 72. The filter P4 therefore has a structure which resembles a pipe organ, with the devices 68, 70 and 72 being disposed in parallel and with each device 68, 70 or 72 being slightly longer than the preceding one.

Filter P4 has digital shift registers 74 operably connected to data and address bus lines 76 and 78, respectively. Each of the shift registers 74 applies its tap weight signal to a multiplying digital to analog converter 80. The multiplying digital to analog converters 80 are each operably connected with the information bearing waveform input 82, and with the input contact of the associated ACT device 68, 70 or 72.

The filter P4 uses a separate ACT device 68, 70 or 72 for each increment of time delay in the tapped delay line structure. The input signal is applied in parallel to the multiplying digital to analog converters 80 which, in turn, apply tap weighted signals to the input contacts of the individual delay lines 68, 70 and 72. The input signal propagates along the delay lines 68, 70 and 72 in parallel fashion, and the filter output is formed by combining the charge packets from the individual ACT channels 68, 70 and 72 by amplifier 84. A common non-destructive sense electrode 86 may be utilized, or the ACT channels may be merged into a single transport channel. Each device 68 and 70 or 72 has a unitary barrier element 87, rather than the uniformly spaced elements of the other filters.

Figure 7:
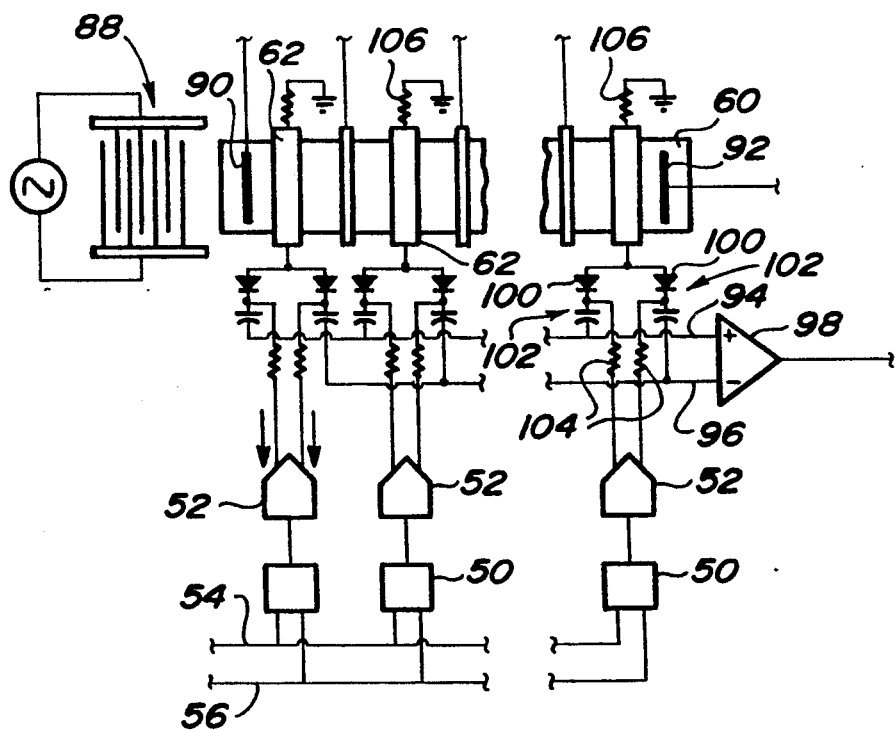
FIG. 7 is a detailed fragmentary schematic plan view of a transversal filter according to FIG. 4.

FIG. 7 discloses in further detail the filter P3 of FIG. 4. A high level RF signal is applied to transducer 88, in order to cause a surface acoustic wave to be generated at the excitation frequency for illuminating the active transport channel of the device 60. The information signal waveform is impressed on a DC bias voltage level and is applied to the input contact 90 so that charge packets may be formed and transported within the transport channel by the propagating surface acoustic wave. The amount of charge in each packet is, as previously explained, proportional to the amplitude of the signal waveform at the particular instant in time when the packet is separated from the neutral region at the input contact. The packets propagate along the channel at the surface acoustic wave velocity, and are individually sensed by the non-destructive Schottky sense electrodes 62 deposited on the piezoelectric semiconductor surface. It is assumed that there are n sense electrodes 62, which are uniformly spaced along the transport channel with the center-to-center spacing corresponding to a time delay T. At the far end of the channel, the packets are extracted through the output contact 92.

Each tap 62 is coupled to summing lines 94 and 96, respectively, and through them with the non-inverting and inverting inputs of differential amplifier 98. The contacts 62 are connected to the summing lines 94 and 96 through diodes 100 and dc blocking capacitors 102. The diodes 100 are forward biased on account of currents supplied by the digital to analog converters 52 through isolation resistors 104 and a ground return path via bias resistors 106. The digital to analog converters 52 are assumed to be programmed to M bits of accuracy by a tap weight word stored in the digital storage registers 50. The tap weights are loaded by providing the M-bit data word and P-bit address word on the corresponding digital buses.

Figure 6:
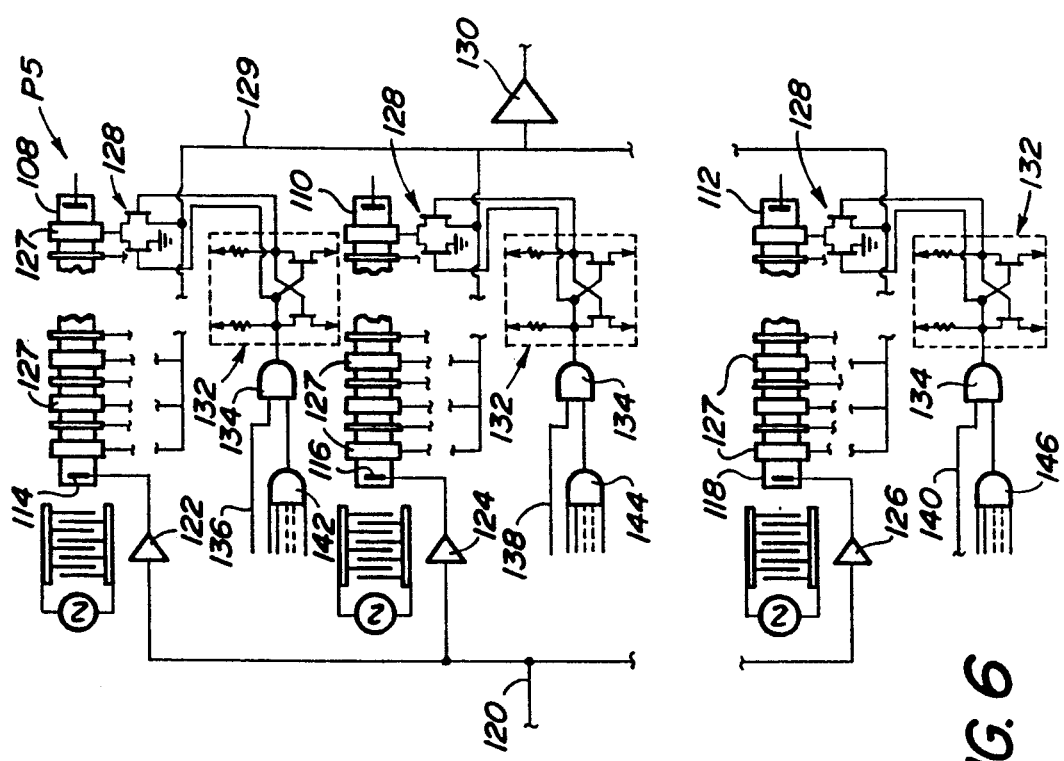
FIG. 6 is a fragmentary schematic plan view of a fifth embodiment of a transversal filter according to the invention.

FIG. 6 discloses filter P5, comprising ACT devices 108, 110 and 112, although a practical device would have as many as 8 ACT devices and the three illustrated devices are merely for explanatory purposes. The input contacts 114, 116, and 118, respectively, are connected in parallel to information bearing signal source 120. Amplifiers 122, 124 and 126 are interposed between contacts 114, 116 and 118, respectively, and source 120 and the amplifier gains are proportional to each other by a factor of $\frac{1}{2}^n$, where n is the number of delay lines.

Each of the taps 127 of the ACT devices 108, 110 and 112 is appropriately connected through a pair of switches 128 to ground or to the output summing line 129 leading to buffer amplifier 130, although only one switch pair is shown for each device. The switches 128 are, preferably, GaAs MESFETS. Naturally, for each tap there is a corresponding pair of switches 128, and the devices 108, 110 and 112 have a common number of taps 127 which are uniformly spaced apart.

Operation of the MESFET switch pairs 128 is controlled by the complementary outputs of binary latches 132. The binary latches 132 act as a tap weight memory for a single bit of the digital tap weight word. Naturally, the memory cells 132 require data to be input through sources 136, 138 and 140, while address decoding logic means 142, 144 and 146 are likewise provided.

Appropriate programming of the binary latches 132 causes selective operation of the switch pairs 128. The information bearing input signal for each device 108, 110 and 112 is multiplied by the preselected gain of the associated amplifiers 122, 124 or 126. Selective operation of the switches of the switch pairs 128 by the associated binary latches 132 is used as a means for programming the tap weights. The amplifier 130 sums the products of the switch pairs 128, with the result that grounding of the appropriate switch of a switch pair 128 causes that portion of the multiplied signal to be deleted from the summation conducted by the amplifier 130. Conversely, connection to summing line 129 causes the signal to form part of the summation. The tap weight coefficient is therefore based upon the sum of the amplifier coefficients times the bit code. We prefer that there be at least eight ACT devices in the filter P5, with the result that the tap weight may be adjusted from 1 through 1/256 within approximately 0.5% accuracy.

Figure 8:
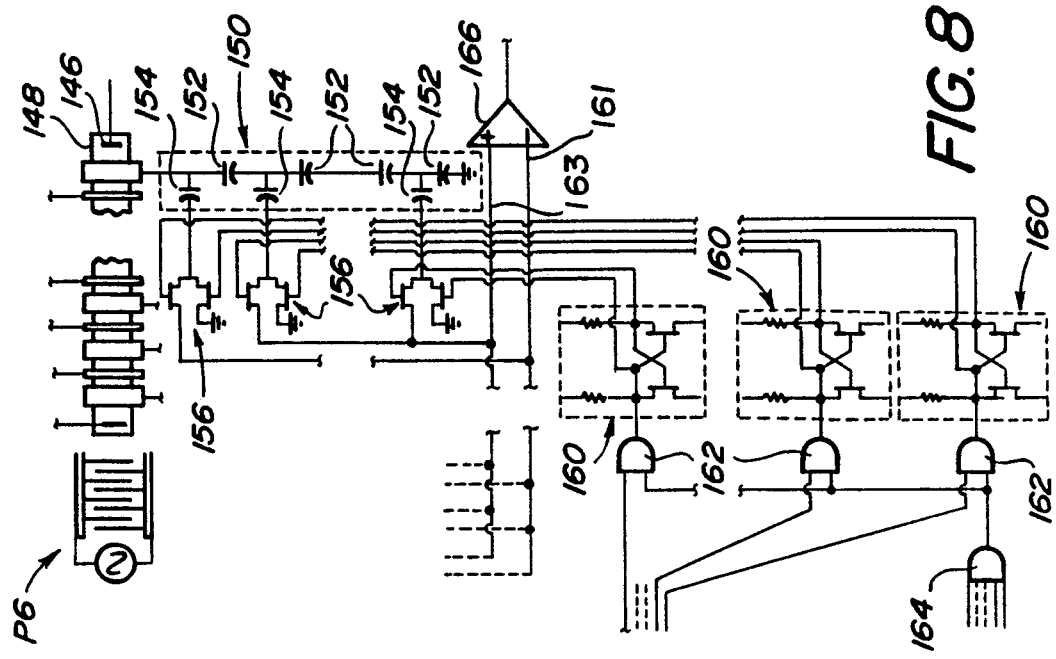
FIG. 8 is a fragmentary schematic plan view of a sixth embodiment of a transversal filter using twos complement sign weigthing according to the invention.

Filter P5 of FIG. 6 provides a very compact device which minimizes the distance required between the taps 127. Those skilled in the art will appreciate that the greater the number of taps, then the greater the accuracy and precision of the transversal filter. The simplicity of the filter P5 should be contrasted with the relative complexity of the filter P6 of FIG. 8.

The filter P6 uses an approach commonly known as twos complement and directly implements a four quadrant multiplication function. The filter P6 has a single ACT device 146 with associated transducer, input and output contacts, taps and Schottky barrier plates. Each of the taps or non-destructive sense electrodes 148 is operably connected to capacitive divider network 150, although only one network 150 is illustrated. The series branches 152 of the network 150 have capacitor values of 2 Co, while the shunt branches 154 incorporate capacitors having a value of Co, and switches 156. The switches 156 are, preferably, GaAs MESFETS and connect the shunt branch either to ground or to one of the summing lines that lead to the differential amplifier 158.

Each section of the network 150 has the effect of halving the current originating with the associated tap 148. Current injected into the first branch of network 150 from a tap 148 is reduced by 50% through the first shunt branch 154, and is further reduced by 50% for each subsequent shunt branch. The result is that the current in the last shunt branch has a value proportional to $\frac{1}{2}^n$, where n equals the number of branches.

Operation of the MESFET switch pairs 156 is controlled by the complementary outputs of binary latches 160. The binary latches 160 comprise the tap weight memory for a single bit of the digital tap weight word. The switch 156 directs the divided image charge on the first shunt branch either to ground or to the inverting summing node 161. All subsequent shunt branches direct charge through a respective SPDT switch 156 either to ground or the non-inverting summing node 163. Each binary latch 160 is loaded from the data bus when enabled by the decoded address word. The logic circuits which load the data into the memory cells 162 and decode the address words 164 are used for controlling operation of the binary latches 160, and therefore the switch pairs 156.

The charge division errors in a properly designed charge divider network 150 are similar of each stage of division, thus the absolute error is proportional to the charge input of a given divider stage. The twos complement format results in absolute errors that are relatively constant regardless of the magnitude of the multiplication factor.

The summing nodes 161 and 163 serve as inputs to a differential voltage amplifier 166 which provides an output signal in the form of a voltage. The amplifier 166 sums the products produced by each of the switch pairs 156, and the sums are based upon the tap weight signals produced by the cooperative action of the binary latches 160 and the switch pairs 156 for all taps 148. As with the filter P5, appropriate programming of the binary latches 160 has the effect of impressing a tap weight signal upon the capacitor network 150 as a means for providing a tap weight coefficient used in the multiplication process.

Figure 9:
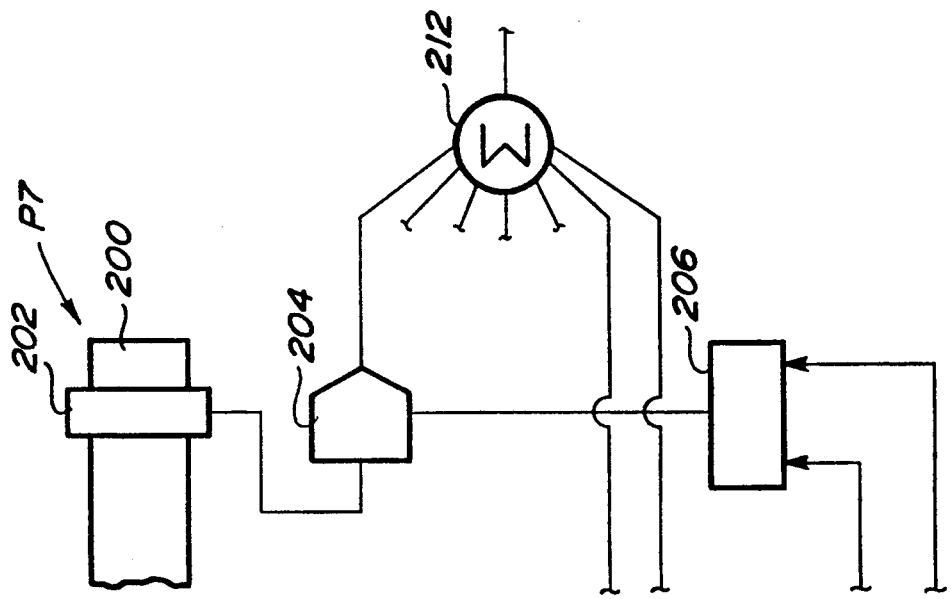
FIG. 9 is a fragmentary schematic plan view of a seventh embodiment of a transversal filter according to the invention.
Figure 9:
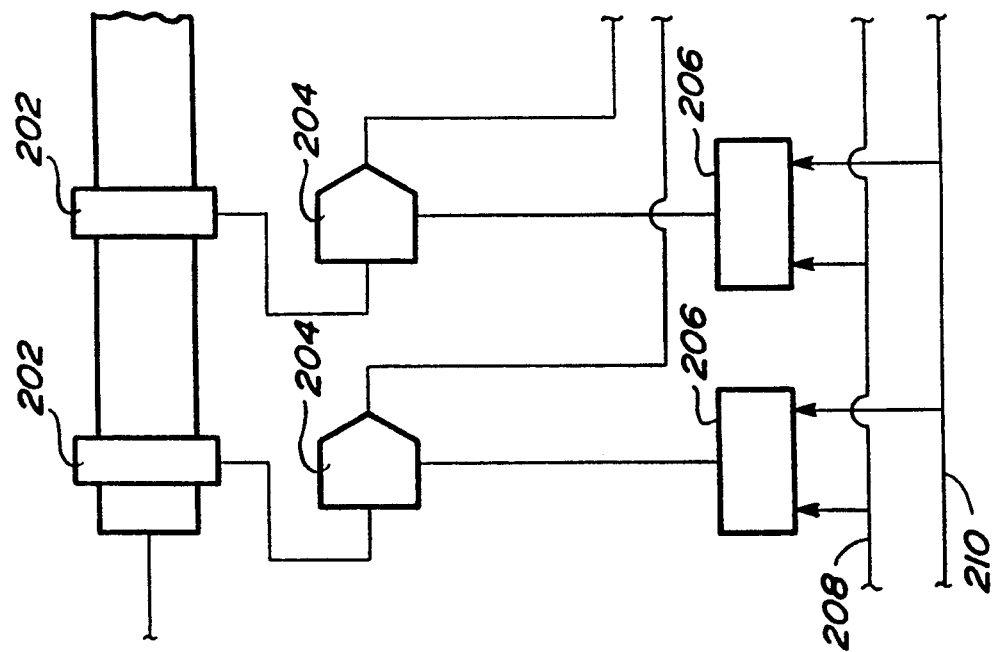

Filter P7, as best shown in FIG. 9, has ACT device 200 and taps 202. Each of the taps 202 is operably connected to a multiplying digital to analog converter 204. The other input of each of the multiplying digital to analog converters 204 is operably connected to digital shift register 206.

Data bus 208 provides one bit of the binary tap weight word to the registers 206. Address bus 210 is likewise operably connected to each of registers 206 in order to assure that the appropriate tap weight is loaded into the register 206 for transmission to the associated multiplying digital to analog converter 204.

As with the other filters, the multiplying digital to analog converters 204 generate a product signal based upon the charge sensed by the associated tap 202 and the tap weight transmitted from the associated register 206. The products are summed by summer 212, and thereby outputted for further use.

Figure 10:
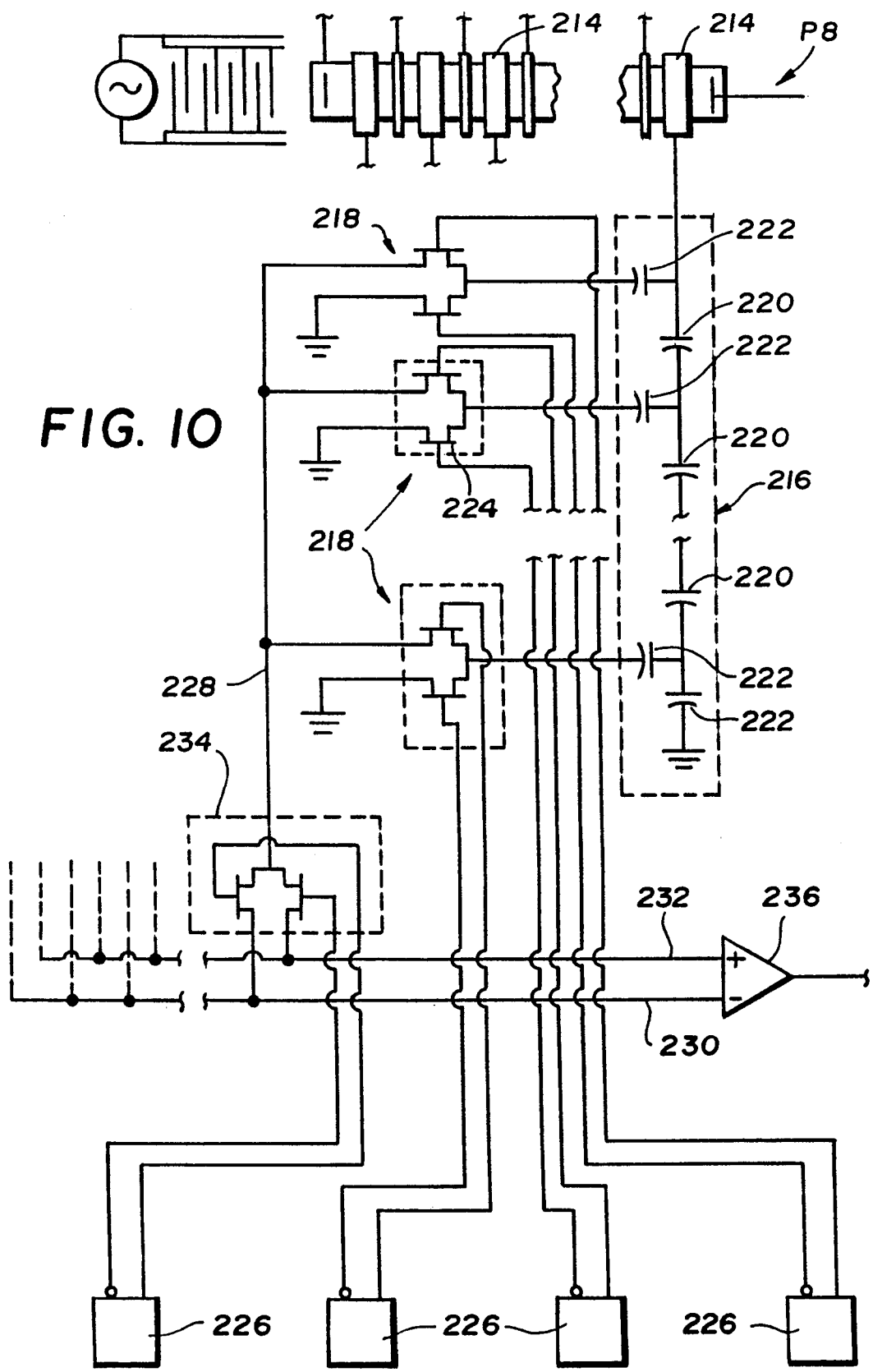
FIG. 10 is a schematic view of another embodiment of a transversal filter with sign/magnitude tap weighting format according to the invention.

FIG. 10 discloses a programmable transversal filter P8 using one ACT device. The device P8 has a plurality of taps 214 corresponding to the non-destructive sense electrodes 26 of the ACT device of FIG. 2.

Each non-destructive charge sensing electrode 214 is operably connected to a multiplier circuit that provides as its output a quantity of charge that is proportional to the product of the induced charge on the sensing electrode and a digital word that is stored in associated memory circuits. The multiplier is implemented as a capacitive charge divider network 216 and switches 218. The series branches 220 of the network 216 are capacitors with a value of 2 Co, while the shunt branches 222 incorporate capacitors having a value of Co. Each section of the divider network 216 divides charge in half resulting in charge on each shunt output branch 222 that is half that of the previous branch provided that the shunt output branch 222 is connected to a low impedance relative to the impedance of the shunt output branch. Each shunt output branch 222 of the binary charge divider circuit 216 is connected to a single pole—double throw (SPDT) switch 218 comprised of two metal-semiconductor field effect transistors (MESFETs) 224. The operation of each switch 218 is controlled by the complementary outputs of a binary latch 226, which is the memory for a single bit of the digital word multiplication factor. The switch 218 directs the charge on the shunt output branch 222 either to ground, or to a tap summing node 228. The tap summing node 228 is connected to either the inverting summing node 230 or the non-inverting summing node 232 through the SPDT MESFET switch 234, which effectively implements the sign of the digital multiplication factor. The summing nodes 230 and 232 serve as charge accumulators that are connected to the inputs of a differential voltage amplifier 236. The output charge is accumulated on the capacitance associated with the loading capacitance of all tap summing nodes 228 that are connected to the summing nodes 230 and 232, generating the input signal voltage to the differential amplifier 236. Since the summing node impedance is not exactly zero, charge division in each section of the charge divider network 216 is not precisely one half. This results in small multiplication errors which are a function of the capacitive load on the summing node.

The charge divider circuit 216 provides a constant load capacitance on the non-destructive sensing electrode 214 regardless of the state of the switches 218 in the multiplier circuit. Charge division between the charge divider network 216 and the non-destructive charge sensing electrode 214 capacitance is constant, resulting in a scaling factor on the multiply operation that is the same for all taps.

The load capacitance the charge divider circuit 216 presents to the tap summing node 228 is a function of the state of the switches 218 in the multiplier circuit. Thus, the contribution of a multiplier circuit to the total capacitance on the summing node 230 and 232 to which it is connected is a function of the multiplication factor that is applied as a digital word to the multiplier circuit. The result of this is that all taps that are connected to a given summing node have a scaling factor applied to their contribution to the overall response that is dependent on the digital inputs of all other multiplier circuits that are connected to the same summing node. This scaling factor is the same for all taps connected to a given summing node, but may be different than the scaling factor for the other summing node. For example, if 90 percent of the total number of taps are connected to the inverting summing node, the attenuation factor due to capacitive loading is 9 times greater on the inverting summing node compared to the non-inverting summing node. These deviations from ideal transversal filter behavior must be compensated for when programming the response of the transversal filter. The computation required to perform this compensation is very complex.

Figure 11:
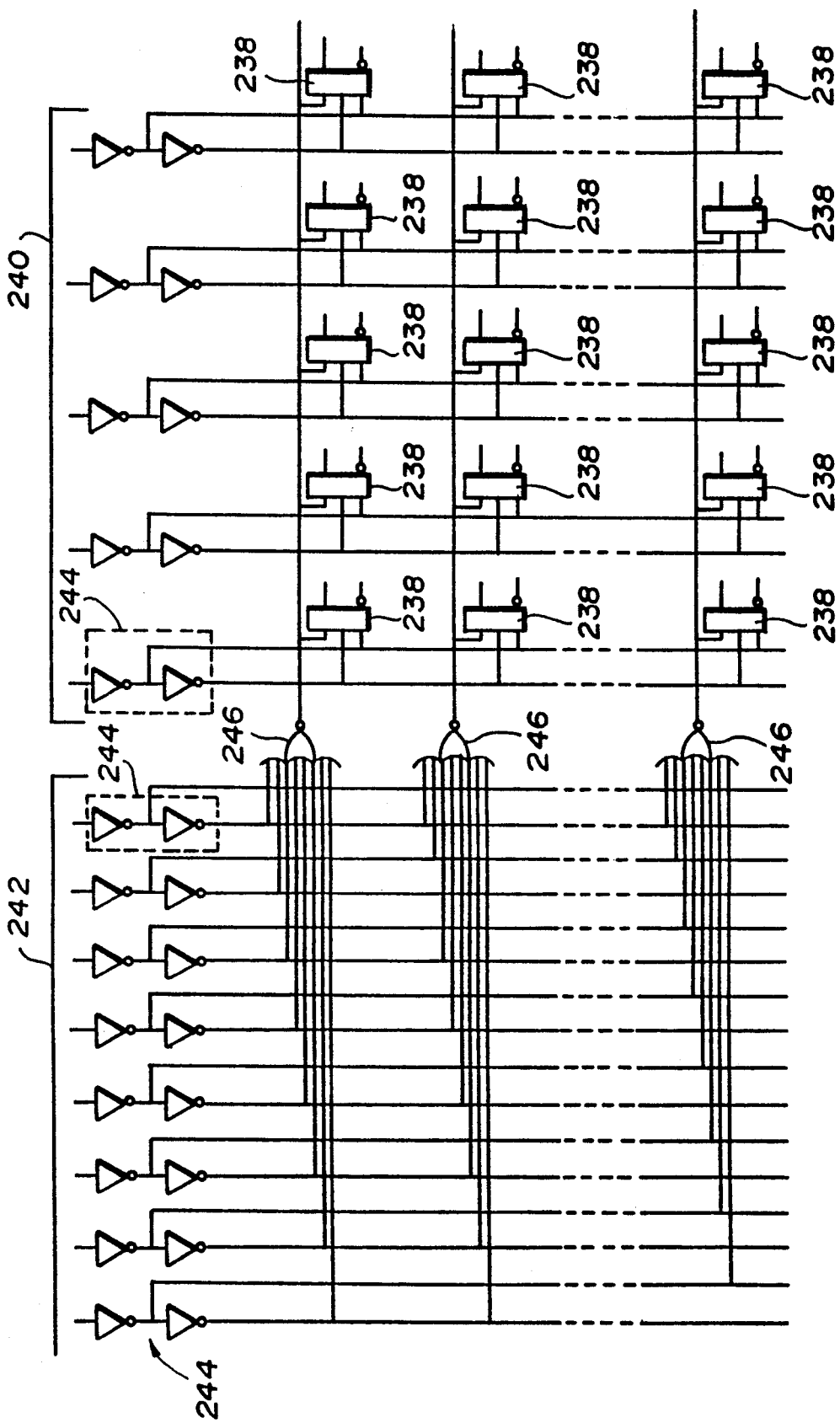
FIG. 11 is a schematic view of a means for programming the tap weights of the transversal filters of FIGS. 8 and 10; and, FIG. 12 is a schematic of an alternative NDS sensing amplifier configuration for use with the present invention.

The overall filter response of the filter P8 is programmed by writing tap multiplier coefficient data to the binary latch memory circuits. Referring to FIG. 11, each binary latch 238 is loaded from an 5 bit data bus 240 when enabled by the decoded word on an 8 bit address bus 242. This assumes that there are four shunt output branches 222 in the filter P8 of FIG. 10. Input interface circuits 244 translate external logic levels to internal logic levels and provide complementary outputs for the address decoder circuits 246 and inputs of latch 238. The digital logic and interface circuits which load the tap multiplier coefficient data into the memory cells and decode the address words are used for controlling the binary latches 238, and therefore the switches 218 and 234 of filter P8 of FIG. 10. Those skilled in the art will recognize that there are numerous configurations for the logic that provide the means for setting the state of the multiplier coefficient memory circuits.

Although the memory circuits have been described as a static random access memory, they can also be incorporated as components of a digital shift register.

Figure 12:
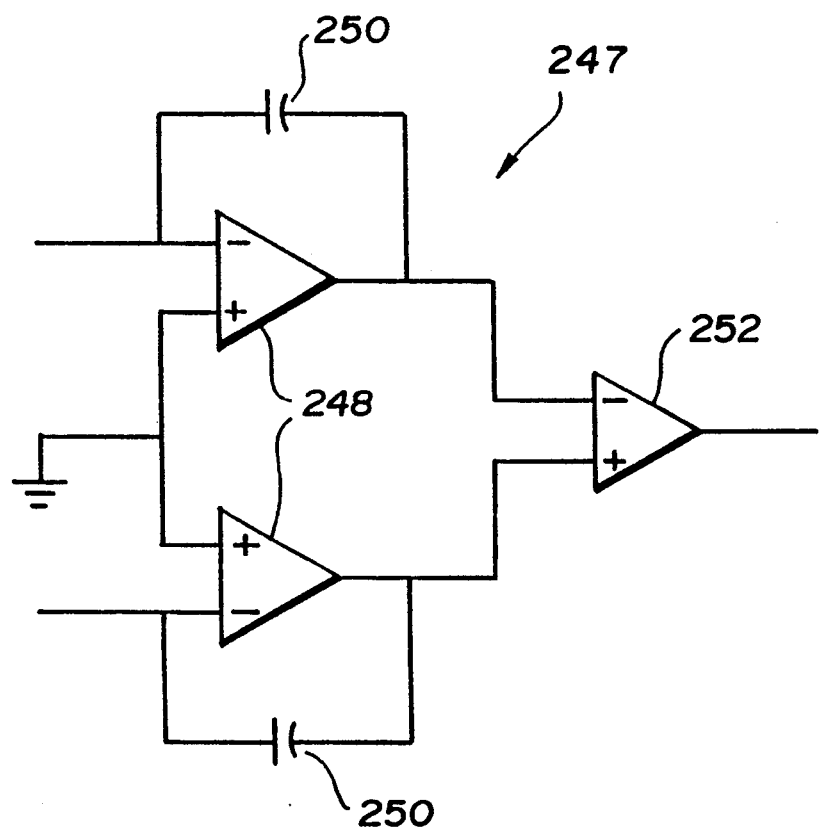

The deviations from ideal transversal filter behavior that are due to the state dependant loading capacitance of the multiplier circuits can be minimized by employing the differential integrator circuit 247 shown in the alternative sense amplifier embodiment of FIG. 12. If the amplifiers 248 were ideal operational amplifiers (op-amps), all input charge is accumulated on the feedback capacitors 250 since the effective input capacitance is infinite. The charge to voltage transfer function is inversely proportional to the capacitor 250 value and the output differential amplifier 252 voltage gain. The practical requirement of the circuit is that the effective input capacitance be much greater than the summing node capacitance due to the loading capacitance of the multiplier circuits connected to the summing nodes.

Although the integrator circuit 247 alleviates the non-ideal behavior of the programmable transversal filter, the gain-bandwidth product of presently achievable op-amp circuits does not support circuit operation over the full frequency bandwidth of several hundred MHz that the ACT transversal filter can provide. Despite these limitations, the integrator circuit can be successfully employed in applications that do not exploit the full bandwidth capability of the ACT PTF.

The capacitive charge division network 216, polarity switch 234, and differential amplifier 236 or differential integrator circuit 247 constitute sign/magnitude format weighting. That is, the multiplier performs an effective multiplication of the analog charge input and the digital multiplication factor which represents a magnitude, while the polarity switch 234 implements the sign of the tap multiplication factor. Alternative weighting formats which employ charge division networks are possible.

The charge division errors in a properly designed charge divider network are similar for each stage of division, thus the absolute error is proportional to the charge input of a given divider stage. For this reason the sign/magnitude format implements multiplication factor accuracy that is proportional to the multiplications factor.

While this invention has been described as having a preferred design, it is understood that it is capable of further uses, modifications and/or adaptations of the invention, following in general the principle of the invention and including such departures from the present disclosure as come within known or customary practice in the art to which the invention pertains, and as may be applied to the central features hereinbefore set forth, and fall within the scope of the invention of the limits of the appended claims.

What is claimed is:

1. Transversal filter comprising:
   a) an acoustic charge transport device comprising input means for introducing a signal into buried channel through which the signal is transported by a high frequency acoustic wave and a plurality of non-destructive sense electrodes overlying the channel for successively sampling the signal;
   b) a plurality of programmable means for storing tap weight signals, each storing means operably associated with one of said electrodes for applying the associated tap weight signal thereto;
   c) a plurality of multiplier means, each multiplier means operably associated with one of said electrodes and with the associated storing means for generating the product of the signal sample and the tap weight signal at the associated electrode;
   d) means operably associated with said multiplier means for summing the products and thereby generating an output signal; and
   e) said storing means including a second acoustic charge transport device comprising input means for introducing a tap weight signal into a buried channel through which the signal is transported by a high frequency acoustic wave and a plurality of non-destructive sense electrodes for sampling the tap weight signal, each electrode of said second device being operably connected with said multiplier means for supplying the associated tap weight signal thereto.

2. The filter of claim 1, wherein said storing means includes:
   a) sample and hold circuit means for storing the tap weight signals.

3. Programmable transversal filter, comprising:
   a) a plurality of acoustic charge transport devices;
   b) each of said acoustic charge transport devices comprising a piezoelectric semiconductor substrate overlaid with a barrier material for therewith defining a buried channel, transducer means operably associated with said channel for propagating a high frequency acoustic wave through said channel, input means at one end of said channel for injecting charge representative of a signal into said channel so that the charge is transported by the wave therethrough and output means at an opposite end of said channel for extracting the charge therefrom, and a plurality of electrodes overlies said channel for sampling the charge that is transported therethrough;

b) a plurality of amplifier means, each amplifier means being operably associated with one of said input means for applying an associated tap weight signal thereto and the gain of each amplifier means is proportional to the gain of the next precedent amplifier means;

c) a plurality of programmable storage means, each storage means for storing a plurality of tap weight signals, each tap weight signal for being associated with one of said electrodes, each storage means being operably associated with one of said acoustic charge transport devices;

d) means operably associated with each of said storage means for modifying the tap weight signal of at least one electrode;

e) a plurality of multiplier means, each multiplier means being operably associated with one of said acoustic charge transport devices and with the electrodes thereof for generating the product of the signal sampled at each associated electrode and the associated tap weight signal; and f) means operably associated with said multiplier means for summing the products.

4. The filter of claim 3, wherein each of said storage means comprises:

a) a binary latch having the output thereof operably connected to said multiplier means; and, b) programmable memory means operably associated with the input of said binary latch for controlling operation thereof.

5. The filter of claim 3, wherein:

a) said multiplier means includes a metal semiconductor field effect transistor.

6. Transversal filter, comprising:

a) an acoustic charge transport device comprising input means for introducing a signal into buried channel through which the signal is transported by a high frequency acoustic wave and a plurality of non-destructive sense electrodes overlying the channel for successively sampling the signals;

b) means for storing a plurality of tap weight signals, each tap weight signal for being associated with one of said electrodes;

c) multiplier means operably associated with each of said electrodes and with said storing means for generating the product of the signal sample and at each electrode and the associated tap weight signal;

d) means operably associated with said multiplier means for summing the products and thereby generating an output signal;

e) said storing means including an analog device having means for modifying the tap weight signal of at least one of said electrodes; and, f) said storing means further including a second acoustic charge transport device comprising input means for introducing a tap weight signal into a buried channel through which the signal is transported by a high frequency acoustic wave and a plurality of non-destructive sense electrodes for sampling the tap weight signal, each electrode of said second device being operably connected with said multiplier means for supplying the associated tap weight signal thereto.

7. Programmable transversal filter, comprising:

a) at least a first acoustic charge transport device comprising a piezoelectric semiconductor substrate overlaid with a barrier material for therewith defining a buried channel, transducer means operably associated with said channel for propagating a high frequency acoustic wave through said channel, input means at one end of said channel for injecting charge representative of a signal into said channel so that the charge is transported by the wave therethrough and output means at an opposite end of said channel for extracting the charge therefrom, and a plurality of electrodes overlies said channel for sampling the charge that is transported therethrough;

b) programmable storage means for storing a plurality of tap weight signals, each tap weight signal for being associated with one of said electrodes;

c) means operably associated with said storage means for modifying the tap weight signal of at least one electrode;

d) multiplier means operably associated with each of said electrodes and with said storage means for generating the product of the signal sampled at each electrode and the associated tap weight signal;

e) means operably associated with said multiplier means for summing the products; and, f) said storage means including a second acoustic charge transport device having non-destructive sense electrodes operably connected to said multiplier means for supplying the tap weight signals thereto.

8. Programmable transversal filter, comprising:

a) at least a first acoustic charge transport device comprising a piezoelectric semiconductor substrate overlaid with a barrier material for therewith defining a buried channel, transducer means operably associated with said channel for propagating a high frequency acoustic wave through said channel, input means at one end of said channel for injecting charge representative of a signal into said channel so that the charge is transported by the wave therethrough and output means at an opposite end of said channel for extracting the charge therefrom, and a plurality of electrodes overlies said channel for sampling the charge that is transported therethrough;

b) programmable storage means for storing a plurality of tap weight signals, each tap weight signal for being associated with one of said electrodes;

c) means operably associated with said storage means for modifying the tap weight signal of at least one electrode;

d) multiplier means operably associated with each of said electrodes and with said storage means for generating the product of the signal sampled at each electrode and the associated tap weight signal;

e) means operably associated with said multiplier means for summing the products;

f) plurality of acoustic charge transport devices;

g) a plurality of amplifier means, each amplifier means for applying a tap weight signal to the input means of an associated acoustic charge transport device and the gain of each amplifier means is proportional to the gain of the next precedent amplifier means;

h) a plurality of storage means, each storage means is operably associated with one of said acoustic charge transport devices for storing the associated tap weight signals; and, i) a plurality of multiplier means, each multiplier means being operably associated with one of said acoustic charge transport devices and with the electrodes thereof for generating the product of the signal sampled at each associated electrode and the associated tap weight signal.

9. Transversal filter comprising:

a) an acoustic charge transport device comprising input means for introducing a signal into buried channel through which the signal is transported by a high frequency acoustic wave and a plurality of non-destructive sense electrodes overlying the channel for successively sampling the signal;

b) a plurality of programmable circuit means each of which being operably associated with a respective said electrode for weighting the sampled signal from each of said electrodes, thereby generating a weighted output;

c) means operably associated with said circuit means for summing the weighted output and thereby generating a desired output signal; and d) said programmable circuit means including a divider network.

10. The filter of claim 9, wherein:

a) said divider network includes series and shunt portions;

b) each of said shunt portions includes switch means positionable in one of first and second positions; and c) said first position connects a respective said shunt portion to said summing means and said second position connects a respective said shunt portion to ground.

11. The filter of claim 10, wherein:

a) said switch means are programmable in one of said first and second positions.

12. The filter of claim 10, wherein:

a) each of said switch means comprises a pair of MESFET'S.

13. The filter of claim 9, wherein:

a) said summing means comprises a differential amplifier having inverting and non-inverting outputs; and b) said divider network includes means for switching one of said shunt portions to one of said inverting and non-inverting outputs.

14. The filter of claim 9, wherein:

a) said summing means comprises a differential integrator circuit.

* * * * *